United States Patent
Watson et al.

(10) Patent No.: US 6,644,324 B1
(45) Date of Patent: Nov. 11, 2003

(54) LASER DISCHARGE CHAMBER PASSIVATION BY PLASMA

(75) Inventors: Tom A. Watson, Carlsbad, CA (US); Richard L. Sandstrom, Encinitas, CA (US); Richard G. Morton, San Diego, CA (US); Robert E. Weeks, San Diego, CA (US); John P. Quitter, San Diego, CA (US); Mark R. Lewis, Oceanside, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/518,970

(22) Filed: Mar. 6, 2000

(51) Int. Cl.$^7$ ................................. B08B 7/04

(52) U.S. Cl. ................... 134/1.1; 134/22.18; 134/30

(58) Field of Search ............. 134/1, 1.1, 22.1, 134/22.18, 26, 30; 372/57, 58, 59, 61

(56) References Cited

U.S. PATENT DOCUMENTS

| | | | |
|---|---|---|---|
| 4,890,294 A | 12/1989 | Nishimae et al. | 372/57 |
| 5,009,963 A | 4/1991 | Ohmi et al. | 428/472.2 |
| 5,047,115 A | 9/1991 | Charlet et al. | 156/643 |
| 5,065,405 A | * 11/1991 | Laakmann et al. | 372/82 |
| 5,220,575 A | * 6/1993 | Bosch et al. | 372/87 |
| 5,244,428 A | * 9/1993 | Welsch et al. | 445/28 |
| 5,360,768 A | 11/1994 | Ohmi et al. | 437/238 |
| 5,444,259 A | 8/1995 | Ohmi | 250/452.21 |
| 5,897,847 A | 4/1999 | Jursich et al. | 423/219 |
| 6,024,885 A | 2/2000 | Pendharkar et al. | 216/22 |

FOREIGN PATENT DOCUMENTS

EP 0794 598 A1 10/1997

OTHER PUBLICATIONS

N. Maeno, et al., "Fluorine Passivation of Metal Alloy Surface With Volatile Reaction Enhanced mechanism," (Jul. 1992) J. Electrochem. Soc., vol. 139, No. 7, pp. 1865–1869.
Phil Danielson, "Gas Loads From Elastomer Seals," (Jan. 1999) Vacuum & Thinfilm, pp. 14–15.
Stella Chemifa Corporation, "Fluorine Passivation Technology," (1998) 11 pages.
Ultra Clean Manufacturing Technology Co., Ltd., "CRP & FP—Gas Supply System for the Next Generation of ULSI," (Undated) 16 pages.
N. Miki et al., "Vapor–Liquid Equilibrium of the Binary System HF–$H_2O$ Extending to Extremely Anhydrous Hydrogen Fluoride," (Mar. 1990) J. Electrochem. Soc., vol. 137, No. 3, ©The Electrochemical Society, Inc., pp. 787–790.
N. Maeno, et al., "Fluorine Passivation of Metal Alloy Surface With Volatile Reaction Enhanced mechanism," (Jul. 1992) J. Electrochem. Soc., vol. 139, No. 7, pp. 1865–1869.

(List continued on next page.)

*Primary Examiner*—Alexander Markoff
(74) *Attorney, Agent, or Firm*—William Cray

(57) ABSTRACT

Methods and apparatus are provided for cleaning and passivating laser discharge chambers with plasmas. In one embodiment, an oxygen based plasma is formed in a plasma source external to the laser discharge chamber by applying a radiofrequency signal to oxygen containing gases. The oxygen based plasma is drawn into the laser discharge chamber, where it reacts with contaminants and cleans internal surfaces. After cleaning, a fluorine based plasma is formed in the plasma source and drawn into the laser discharge chamber to passivate internal surfaces. In another embodiment, cleaning with the oxygen based plasma is not used since some level of cleaning is accomplished with the fluorine based plasma. In another embodiment, oxygen based plasmas and fluorine based plasmas are formed in the laser discharge chamber by applying a radiofrequency signal to a laser discharge chamber electrode. Plasma cleaning and passivation of laser discharge chambers is safer, more efficient, and more effective than conventional thermal cleaning and passivation processes.

19 Claims, 3 Drawing Sheets

OTHER PUBLICATIONS

N. Maki et al., "Fluorine Passivation of Metal Surface for Self–Cleaning Semiconductor Equipment," (Feb. 1990) IEEE Transactions on Semiconductor Manufacturing, vol. 3, No. 1, pp. 1–11.

M. Maeno et al., "Optimization of Fluorine Passivation of Stainless Steel Surfaces," (May 1992) IEEE Transactions on Semiconductor Manufacturing, vol. 5, No. 2 pp. 107–113.

Hashimoto Chemical Corporation, "Fluorine Passivation Technology," (1997) pp. 1–11.

M. Maeno et al., "Fluorine–Passivated Electroless Ni–P Films," (Oct. 1994) J. Electrochem. Soc., vol. 141, No. 10, ©The Electrochemical Society, Inc., pp. 2649–2654.

G.M. Jurisch et al., "Gas Contaminant Effects in Discharge–Excited KrF Lasers," (Apr. 20, 1992) Applied Optics, vol. 31, No. 12, pp. 1974–1981.

W. Holber et al., "Reducing PFC Emissions From CVD Reactors," (Mar. 1999) Vacuum & Thinfilm, pp. 26–29.

Future Fab International, "XPS Analysis on Fluorine Removal by Plasma Cleaning," (Undated) pp. 289–293.

P.M. Clarke et al., "Gas–Phase Interactions Between $WF_6$ and Metal Surfaces," (1994) Conference Proceedings ULSI–IX—Materials Research Society, pp. 411–417; 59 68.

Y. Shirai et al., "Fluorine Passivation of Metal Surface," (1996) CleanRooms '96 West Session 602, pp. 68–71.

Phil Danileson, "Rate–of–rise Measurements," (Nov./Dec. 1998) Vacuum & Thinfilm, pp. 12–13.

Vacuum & Thinfilm, "The Evolution of RF," (Nov./Dec. 1998) pp. 30–33.

Y. Minamitani et al., "Characteristics of A Corona Reactor As A Gas Purifier For Excimer Lasers," (Undated) pp. 1–18.

H.E. Litvak, "End Point Control Via Optical Emission Spectroscopy," (1996) J. Vac. Sci. Technol. B14(1), pp. 516–520.

D.W. Greve et al., "Process Control Based On Quadrupole Mass Spectrometry," (1996) J. Vac. Sci. Technol. B14(1), pp. 489–493.

Los Alamos National Laboratory, "Excimer Laser Chemical Problems," (1985) U.S. Dept. of Commerce, 81 pages.

Kazuhide Ino et al., "Plasma Enhanced In Situ Chamber Cleaning Evaluated by Extracted–Plasma–Parameter Analysis," (1996) IEEE Transactions on Semiconductor Manufacturing, vol. 9, No. 2, pp. 230–240.

Kenji Komine et al., "Residuals Caused by The $CF_4$ Gas Plasma Etching Process," (May 1996) Jpn. J. Appl. Phys. vol. 35, pp. 3010–3014.

A.L. Cabrera et al., "Surface Analysis Of Copper, Brass, and Steel Foils Exposed to Fluorine Containing Atmospheres," (1990) J. Vac. Sci. Technol. A8, pp. 3988–3996.

I. Kazuhide et al., "In Situ Chamber Cleaning Using Halogenated–Gas Plasmas Evaluated by Plasma–Parameter Extraction," (Jan. 1994) Jpn. J. Appl. Phys. vol. 33, pp. 505–509.

\* cited by examiner

US 6,644,324 B1

LASER DISCHARGE CHAMBER PASSIVATION BY PLASMA

BACKGROUND

1. Field of the Invention

The invention relates to methods and apparatus for cleaning and passivating laser discharge chambers. More particularly, the invention relates to methods and apparatus for cleaning and passivating laser discharge chambers utilizing plasmas.

2. Description of the Related Art

Gas lasers in which the lasing medium includes fluorine or fluorine compounds are the workhorse light sources for the integrated circuit lithography industry. In fluorine based gas lasers such as krypton fluoride (KrF) excimer lasers, argon fluoride (ArF) excimer lasers, and molecular fluorine ($F_2$) lasers, a high energy electrical discharge excites a gas mixture in a discharge chamber to produce a plasma which serves as the lasing medium.

The performance of such lasers is degraded by the presence of impurities in the discharge chamber inadvertently introduced as contaminants during the manufacturing process, introduced by exposure to the ambient environment, or produced by reactions between the gas mixture and contaminants or chamber materials. Such impurities include HF, $CF_4$, $COF_2$, $SiF_4$, $CO_2$, various hydrocarbons, and $H_2O$. Impurities can degrade the profile of the laser beam by fouling optical components, reduce the lifetime of the gas fill by reacting with and consuming the gas mixture, and reduce output power by absorbing laser light and by quenching the excited species such as ArF, KrF, and $F_2$ that support lasing. Also, highly reactive impurities such as HF corrode the internal surfaces of the discharge chamber. Impurities are detrimental even at low concentrations. For example, it has been observed that the presence of $CO_2$ at concentrations as low as 30 parts per million in a KrF excimer laser plasma can reduce the output power of the laser by 5%. Consequently, the discharge chamber must be cleaned of impurities.

The plasma lasing medium includes highly reactive fluorine species which also corrode unprotected internal surfaces of the discharge chamber. Consequently, the materials in the discharge chamber must be passivated to protect them from the plasma lasing medium.

Laser discharge chambers for fluorine based gas lasers are conventionally cleaned and passivated with a thermal process such as the following. A discharge chamber is heated to approximately 100° C. and evacuated with a vacuum pump to a pressure of approximately 20 millitorr. This temperature and pressure is maintained for at least 8 hours, during which some of the volatile contaminants in the discharge chamber, such as water, are removed by the pump. The discharge chamber is then filled with a mixture of approximately 5% $F_2$ and approximately 95% helium, neon, or other inert gas at a pressure of approximately one atmosphere. The temperature is maintained at 100° C. for at least 4 hours, during which a fluorine based passivation layer forms on some of the internal surfaces of the discharge chamber.

The fluorine gas used in conventional processes poses a safety risk, as it is highly corrosive and highly toxic. Also, the conventional process is not entirely effective. The discharge chamber must undergo a subsequent 24 hour burn-in operation period, during which the gas mixture is replaced multiple times, before laser operation is satisfactory. Furthermore, the conventional process requires at least 12 hours, more typically 24 to 48 hours, and is therefore inefficient.

What is needed is a laser discharge chamber cleaning and passivation process that is safer, more effective, and more efficient than conventional cleaning and passivation methods.

SUMMARY

Methods and apparatus are provided for cleaning and passivating laser discharge chambers with plasmas. In one embodiment, an oxygen based plasma is formed in an external plasma source by inductively applying a radiofrequency signal to oxygen containing gases such as $O_2$, $N_2O$, and mixtures thereof. The oxygen based plasma is drawn into the laser discharge chamber, where it reacts with contaminants to produce volatile species which are removed by a vacuum pump, thereby cleaning the laser discharge chamber.

After the oxygen based plasma cleaning process, a fluorine based plasma is formed in the external plasma source by inductively exciting fluorine containing gases such as $NF_3$, $F_2$, $CF_4$, $SF_6$, and mixtures thereof with a radiofrequency signal. The fluorine based plasma is drawn into the laser discharge chamber, where it reacts with internal surfaces to form a protective passivation layer. The fluorine based plasma also reacts with contaminants to produce volatile species which are removed by the vacuum pump. Internal surfaces of the laser discharge chamber are thereby cleaned and passivated. Since the fluorine based plasma also cleans the chambers, the oxygen based plasma cleaning process is optional.

In another embodiment, oxygen based plasma and fluorine based plasmas are formed in the laser discharge chamber by applying a radiofrequency signal to a laser discharge chamber electrode and thereby exciting oxygen containing gases and fluorine containing gases. The oxygen and fluorine based plasmas react with contaminants and with internal surfaces to clean and passivate the laser discharge chamber.

Plasma cleaning and passivation of laser discharge chambers does not require the use of dangerous $F_2$ gas. Also, plasma cleaning and passivation is much less time consuming, and thus much more efficient, than conventional thermal cleaning and passivation processes. Moreover, laser discharge chambers cleaned and passivated with plasmas exhibit improved performance.

DETAILED DESCRIPTION

Figure 1:
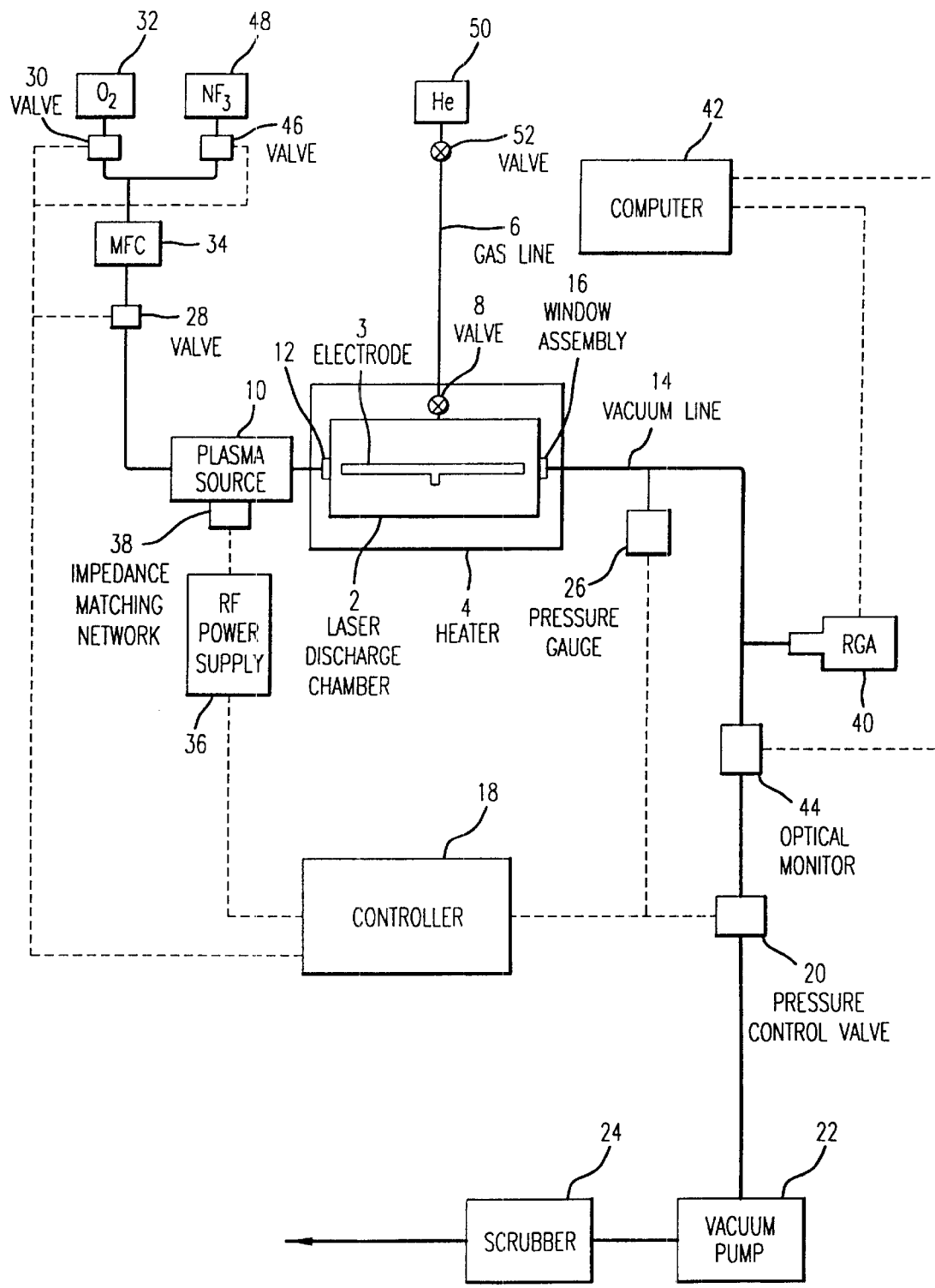
FIG. 1 is a schematic diagram of an apparatus including an external plasma source for cleaning and passivating a laser discharge chamber in accordance with one embodiment of the present invention.

FIG. 1 is a schematic diagram of an apparatus for cleaning and passivating a laser discharge chamber 2 with plasmas according to one embodiment of the present invention. Laser discharge chamber 2 may be, for example, a discharge chamber for a KrF excimer laser such as the model 5000 KrF excimer laser manufactured by Cymer, Incorporated. The model 5000 discharge chamber has a volume of about 20 liters and internal surfaces of brass, electroless nickel plated aluminum, and ceramic. Laser discharge chamber electrode 3, inside laser discharge chamber 2, is typically a conducting metal or metal alloy such as brass. Other laser discharge chambers, such as discharge chambers for ArF excimer lasers and discharge chambers for molecular fluorine ($F_2$) lasers, may also be cleaned and passivated in accordance with the present invention.

Laser discharge chamber 2 is placed in contact with a heater 4, which heats discharge chamber 2 to an elevated temperature, in one embodiment about 70° C., thereby driving volatile contaminants from internal surfaces of discharge chamber 2 and also facilitating subsequent passivating chemical reactions on those surfaces. Heater 4 may be an electrically heated metal plate on which discharge chamber 2 is placed and enclosed with a cover, for example. The present invention is independent of the type of heater used. In one embodiment, the temperature of discharge chamber 2 settles at about 70° C. after about 45 minutes of heating.

After being installed on heater 4, laser discharge chamber 2 is connected to a purge gas line 6 at a discharge chamber valve 8, to an external plasma source 10 at a discharge chamber window assembly 12, and to a vacuum line 14 at a discharge chamber window assembly 16. Advantageously, with this geometry plasmas may be drawn the length of discharge chamber 2 to uniformly clean and passivate internal discharge chamber surfaces. Of course, depending on the design of the chamber, connections to purge gas line 6, plasma source 10, and vacuum line 14 may be made in many other geometries and might utilize chamber windows, valves, and ports not shown in FIG. 1.

All gas lines, vacuum lines, and valves are made from high purity stainless steel to minimize introduction of contaminants into discharge chamber 2. Internal seals in valves and flanges are preferably made of fluorine-resistant metal. Seals made of fluorine resistant perfluoro elastomers such as Kalrez® are also acceptable, however.

In one embodiment, external plasma source 10 is a Delta Glow™ DG 300 or DG 600 inductively coupled high energy plasma source manufactured by Manitou Systems, Incorporated. Advantageously, the antenna of such an inductively coupled plasma source is not in physical contact with the plasma and thus does not introduce contaminants into discharge chamber 2 during the cleaning and passivating process. A quartz glass reactor tube in the Delta Glow™ plasma source is replaced with a 99.8% purity alumina ($Al_2O_3$) tube to prevent etching of the reactor tube by fluorine based plasmas. Other external plasma sources, inductively or directly coupled, are used in alternative embodiments.

Next, programmable controller 18 opens pressure control valve 20 to allow vacuum pump 22 to evacuate vacuum line 14, discharge chamber 2, and external plasma source 10. The exhaust from vacuum pump 22, which in subsequent process steps may contain fluorine compounds, is passed through exhaust waste gas scrubber 24 to remove corrosive or toxic exhaust constituents. The conductance through plasma source 10, discharge chamber 2, and vacuum line 14 is sufficiently high that they are at essentially equal pressure.

In one embodiment, programmable controller 18 is a SYSMAC model C200HG programmable logic controller manufactured by Omron Electronics, Incorporated. Alternative embodiments employ other programmable controllers, or manual control.

Conventional vacuum pumps employing oil are vulnerable to attack by corrosive gases employed or generated in the cleaning and passivating processes. In one embodiment, vacuum pump 22 is a QDP80 dry pump with a pumping capacity of 80 liters per minute manufactured by BOC Edwards, Incorporated.

Controller 18 reads capacitance manometer 26, which measures the pressure in vacuum line 14, and controls pressure control valve 20 to set the pressure in vacuum line 14, discharge chamber 2, and plasma source 10 to about 20 millitorr. In one embodiment, capacitance manometer 26 is a CeramiCel® capacitance manometer manufactured by Varian, Incorporated, and pressure control valve 20 is a model 651CD2S1N pressure control valve manufactured by MKS Instruments, Incorporated. Capacitance manometers provide accurate and stable absolute pressure measurements, facilitating reproducible cleaning and passivation.

After the pressure has reached about 20 millitorr, controller 18 closes valve 20 and monitors the pressure for about 20 minutes to test for leaks. Other conventional leak testing techniques, such as helium leak testing, are also used. After proper installation has been verified, controller 18 reopens valve 20 and vacuum pump 22 again pulls the pressure down to about 20 millitorr.

In one embodiment, discharge chamber 2 is next cleaned with an oxygen based plasma formed in plasma source 10 from gases including oxygen containing gases such as oxygen ($O_2$), $N_2O$, and mixtures thereof, prior to being cleaned and passivated with a fluorine based plasma formed in plasma source 10 from gases including fluorine containing gases such as $NF_3$, $CF_4$, $F_2$, $SF_6$, freons, and mixtures thereof. The fluorine based plasma cleaning and passivation process may be followed by additional oxygen based plasma and fluorine based plasma cleaning and passivation processes. In another embodiment, oxygen based plasma cleaning of discharge chamber 2 is not utilized, and discharge chamber 2 is next cleaned and passivated with a fluorine based plasma. In another embodiment, discharge chamber 2 is cleaned and passivated with an oxygen and fluorine based plasma formed from a mixture of oxygen containing and fluorine containing gases.

In one embodiment, for example, controller 18 opens valves 28 and 30 to allow oxygen to flow from oxygen supply 32, through mass flow controller (MFC) 34, external plasma source 10, discharge chamber 2, and vacuum line 14 to vacuum pump 22. MFC 34, in one embodiment a model 1259C-0050GK MFC manufactured by MKS Instruments, Incorporated, regulates the flow of oxygen to a rate of typically about 10 standard cubic centimeters per minute (sccm) to about 50 sccm. The pressure registered by capacitance manometer 26 rises to about 100 millitorr to about 1.5 torr, depending on the oxygen flow rate. During an optional purge period of from about 1 minute to about 10 minutes duration, flowing oxygen displaces other gases in plasma source 10, discharge chamber 2, and vacuum line 14.

After the optional purge period, and with oxygen continuing to flow through plasma source 10, discharge chamber 2, and vacuum line 14, controller 18 turns on radio frequency (RF) power supply 36. Power supply 36 delivers about 100 Watts to about 600 Watts, in one embodiment about 400 Watts, of 13.56 MHz continuous RF power through impedance matching network 38 to external plasma source 10. The RF power excites the oxygen in plasma source 10 to form an oxygen plasma containing reactive oxygen ions and radicals, which flows from plasma source 10 into and through discharge chamber 2. The oxygen plasma oxidizes hydrocarbon contaminants in discharge chamber 2 to produce volatile reaction products, such as $CO_2$ and $H_2O$, which are removed by vacuum pump 22. Internal surfaces of discharge chamber 2 are thereby cleaned of contaminants.

Since the plasma is excited externally, all internal surfaces of discharge chamber 2 are at equal electrical potential. Advantageously, externally generated plasmas consequently interact uniformly with the internal surfaces of discharge chamber 2.

In one embodiment, RF power supply 36 is a model MS600 power supply manufactured by Manitou Systems, Incorporated capable of delivering up to about 600 Watts at about 13.56 MHz in pulsed or continuous mode to plasma source 10. Though 13.56 MHz is an industry standard, other radio frequencies can also be used. In an alternative embodiment, RF power supply 36 is a model CESAR 136 power supply manufactured by Dressler HF-Technik GmbH. Impedance matching network 38, in one embodiment a model RFS-1004 automatic impedance matching network manufactured by RF Services, Incorporated, maximizes power transfer from RF power supply 36 to the plasma load. In an alternative embodiment, impedance matching network 38 is a model ATR impedance matching network manufactured by Manitou Systems, Incorporated.

An oxygen plasma is formed in plasma source 10 and drawn through discharge chamber 2 for a period of about 0.5 hours to about 2.0 hours, depending upon the RF power used. Higher RF powers produce a more reactive oxygen plasma, which requires less time to clean discharge chamber 2. In one embodiment, the period of exposure to the oxygen plasma is a predetermined period known by experiment to be sufficiently long for the oxygen plasma to satisfactorily clean discharge chamber 2.

In alternative embodiments, exposure to the oxygen plasma continues until an endpoint of the cleaning process is detected. An endpoint may be defined by concentrations of one or more chemical species in the plasma or exhaust gas reaching particular values. For example, the concentration of $CO_2$ in the gas flowing out of discharge chamber 2 decreases as hydrocarbon contaminants are depleted. Thus, an endpoint may be defined by the concentration of $CO_2$ decreasing to reach a particular value which indicates that the chamber is sufficiently clean.

In one embodiment, an endpoint is determined by residual gas analyzer (RGA) 40, which is a model TSPTC 100(2100) RGA manufactured by Leybold Inficon, Incorporated. RGA 40, which is in communication with computer 42 via a conventional RS-232 interface, monitors the concentrations of the various chemical species present in vacuum line 14. In another embodiment, an endpoint is determined by optical monitor 44. Optical monitor 44 excites chemical species present in vacuum line 14 with an electrical discharge, and measures their optical to monitor their concentrations. In another embodiment, an endpoint is determined by monitoring the RF power reflected from plasma source 14. The reflected RF power is known in the art to characterize the plasma.

At the end of the predetermined period of exposure to the oxygen plasma, or when an endpoint is detected, controller 18 closes valves 28 and 30 and turns off RF power supply 36. Vacuum pump 22 pulls the pressure down to about 20 millitorr.

Next, discharge chamber 2 is cleaned and passivated with a fluorine based plasma formed in plasma source 10. In one embodiment, for example, controller 18 opens valves 28 and 46 to allow $NF_3$ to flow from $NF_3$ supply 48, through MFC 34, external plasma source 10, discharge chamber 2, and vacuum line 14 to vacuum pump 22. MFC 34 regulates the flow of $NF_3$ to a rate of typically about 5 sccm to about 25 sccm. The pressure rises to about 100 millitorr to about 1.5 torr, depending on the $NF_3$ flow rate. During an optional purge period of from about 1 minute to about 10 minutes duration, flowing $NF_3$ displaces other gases in plasma source 10, discharge chamber 2, and vacuum line 14.

After the optional purge period, and with $NF_3$ continuing to flow through plasma source 10, discharge chamber 2, and vacuum line 14, controller 18 turns on RF power supply 36. Power supply 36 delivers about 100 Watts to about 600 Watts, in one embodiment about 400 Watts, of 13.56 MHz continuous RF power through impedance matching network 38 to plasma source 10. The RF power excites the $NF_3$ in plasma source 10 to form a fluorine based plasma which contains reactive fluorine species such as F and $F_2$ radicals and ions and produces intense ultraviolet radiation. The fluorine based plasma flows from plasma source 10 into and through discharge chamber 2. Advantageously, high concentrations of reactive fluorine species and intense ultraviolet radiation are introduced into discharge chamber 2 without requiring the use of $F_2$ as a precursor gas.

The fluorine based plasma reacts with contaminants in discharge chamber 2 to produce volatile reaction products, such as HF and $SiF_4$, which are removed by vacuum pump 22. The fluorine based plasma also reacts with the internal surfaces of discharge chamber 2 to form passivating layers which protect the surfaces from further reaction with fluorine based plasmas such as fluorine based plasma lasing media. For example, the fluorine based plasma reacts with Nickel surfaces to form stable $NiF_2$ layers, with stainless steel surfaces to form stable $FeF_2$ layers, and with alumina ($Al_2O_3$) surfaces to form stable $AlF_3$ layers. This passivation process is the primary role of the fluorine based plasma.

The fluorine based plasma is produced in plasma source 10 and drawn through discharge chamber 2 for a period of about 0.5 hours to about 2.0 hours, depending upon the RF power used. As with the oxygen based plasmas, higher RF powers produce a more reactive fluorine based plasma, which requires less time to clean and passivate laser discharge chamber 2.

In one embodiment, the period of exposure to the fluorine based plasma is a predetermined period chosen to be sufficiently long to satisfactorily clean and passivate discharge chamber 2. In alternative embodiments, exposure to the fluorine based plasma continues until an endpoint is detected with RGA 40, with optical monitor 44, or with measurements of reflected RF power. The endpoint may be a particular concentration of molecular fluorine in discharge chamber 2 or vacuum line 14, for example. As the internal surfaces of discharge chamber 2 are passivated, fluorine consumption decreases and the concentration of molecular fluorine grows to a value indicating that discharge chamber 2 is sufficiently clean and passivated.

At the end of the predetermined period of exposure to the fluorine based plasma, or when an endpoint is detected, controller 18 closes valves 34 and 46 and turns off RF power supply 36. Vacuum pump 22 pulls the pressure down to about 20 millitorr. Discharge chamber 2 is checked for leaks, and controller 18 closes pressure control valve 20.

Next, discharge chamber 2, plasma source 10, and vacuum line 14 are back filled with an inert gas such as helium, nitrogen, neon, krypton, and mixtures thereof. In one embodiment, helium from helium supply 50 flows through valve 52, purge gas line 6, and valve 8 to pressurize discharge chamber 2 to about 1 pound per square inch over atmospheric pressure. Under inert gas purge, which prevents ambient air from entering and contaminating discharge chamber 2, plasma 10 and vacuum line 14 are disconnected from discharge chamber 2, and window assemblies 12 and 16 are sealed. Valve 8 is closed, gas line 6 is disconnected, and discharge chamber 2 is removed from heater 4.

Figure 2:
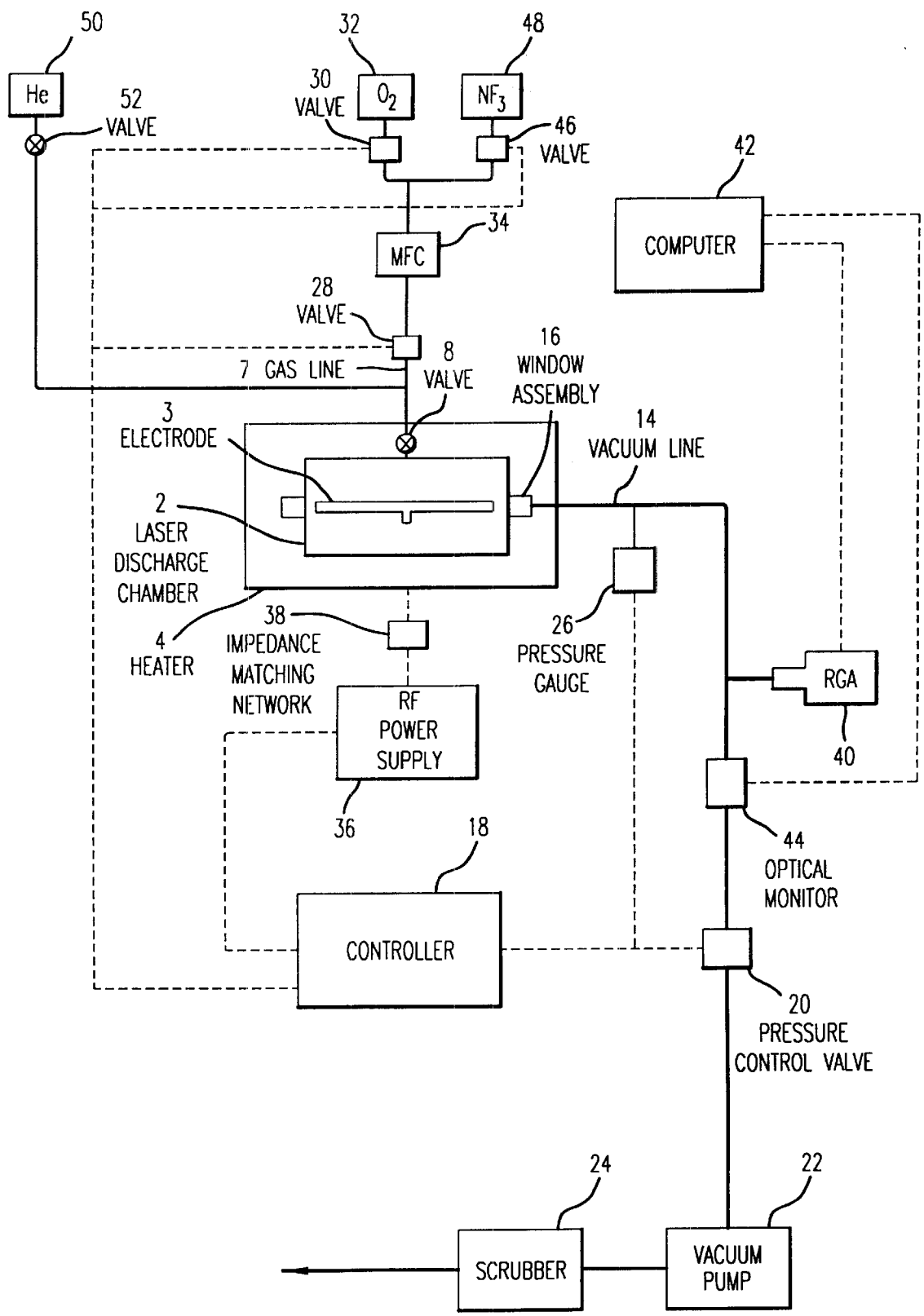
FIG. 2 is a schematic diagram of an apparatus for cleaning and passivating a laser discharge chamber with internally generated plasmas in accordance with one embodiment of the present invention.

Laser discharge chamber 2 may also be cleaned and passivated with internally generated plasmas. FIG. 2 is a schematic diagram of an apparatus for cleaning and passivating a laser discharge chamber 2 with internally generated plasmas in accordance with one embodiment of the present invention. Like numbers in FIG. 1 and FIG. 2 designate the same parts in the various embodiments.

Processes for cleaning and passivating discharge chamber 2 with internally generated plasmas differ from the processes described above utilizing externally generated plasmas primarily in the delivery of precursor gases to discharge chamber 2, and in the coupling of RF power to the plasma. Other process steps and parameters are substantially the same as those described above.

Oxygen and fluorine containing gases, such as those listed above, flow through gas line 7, valve 8, discharge chamber 2, and vacuum line 14 to vacuum pump 22. RF power supply 36 delivers RF power through impedance matching network 38 to discharge chamber electrode 3. Discharge chamber electrode 3 is used in normal laser operation of discharge chamber 2 to generate a fluorine based plasma lasing medium. Here, discharge chamber electrode 3 is used as an RF antenna. The RF power delivered to discharge chamber electrode 3 excites the gases to form oxygen based plasmas and fluorine based plasmas containing reactive chemical species which clean and passivate the internal surfaces of discharge chamber 2. Discharge chamber 2 is subsequently purged with helium delivered through gas line 7 and valve 8.

Advantageously, passivation of laser discharge chambers with plasmas in accordance with the present invention requires only about 2 to 4 hours, rather than the 24 to 48 hours required by conventional passivation processes. Moreover, the performance of lasers with discharge chambers passivated in accordance with the present invention compares favorably to that of lasers with discharge chambers passivated by conventional methods.

Figure 3:
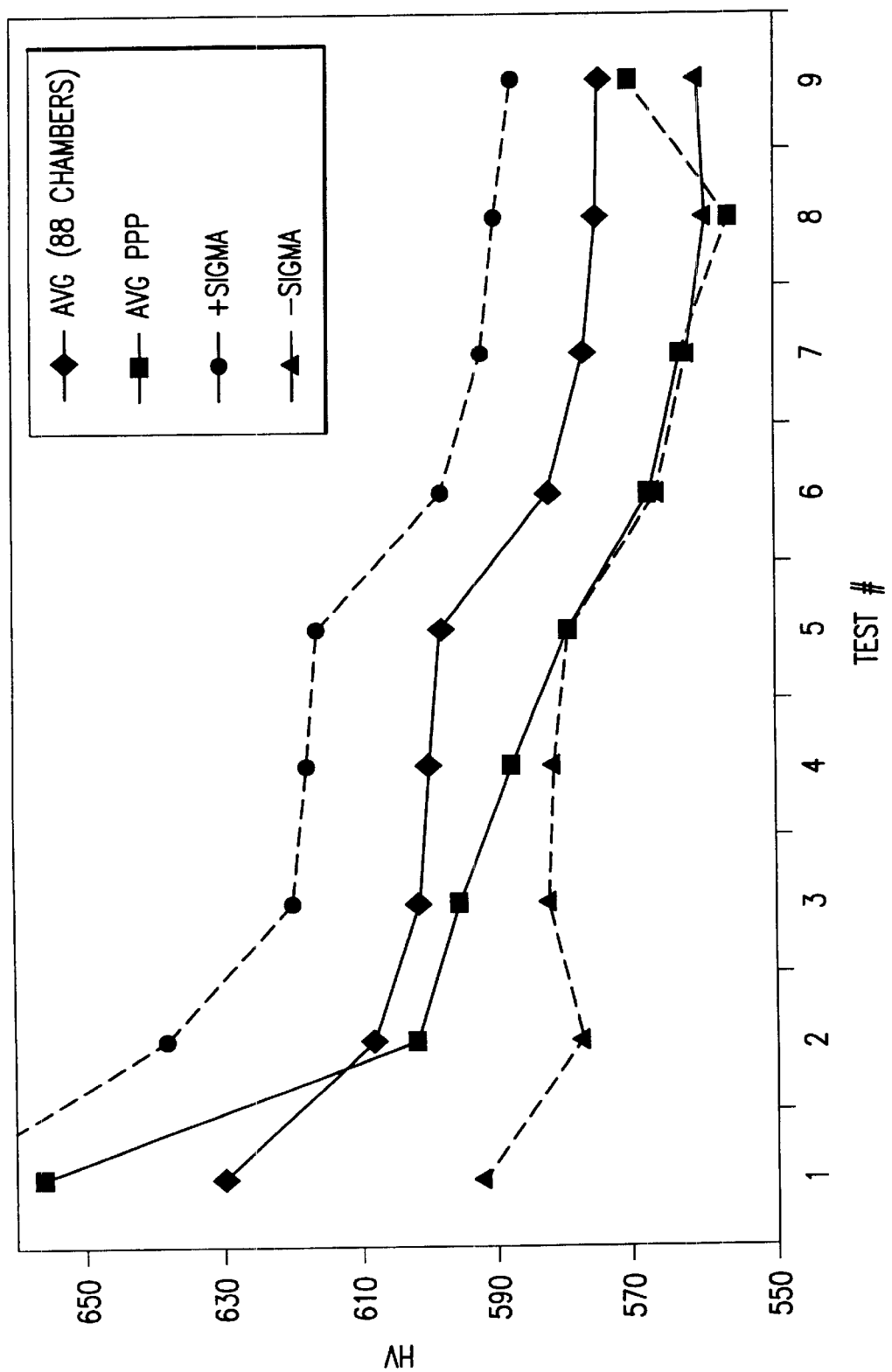
FIG. 3 is plot comparing the performance of laser discharge chambers passivated according to the present invention to laser discharge chambers passivated by conventional methods.

The performance of KrF excimer lasers was evaluated by measuring the normal operation discharge voltage during a series of test periods following initial turn-on of the laser. Lower discharge voltages indicate less fluorine consumption by internal surfaces of discharge chamber 2 during normal operation of the laser, and thus better performance. FIG. 3 is a plot of the normal operation discharge voltage (HV) versus test number for an average of 88 discharge chambers passivated with a conventional thermal process (diamonds), and for an average of about 10 chambers passivated with plasmas in accordance with the present invention (squares). The plasma passivated chambers were first cleaned for about 2 hours with an externally generated oxygen plasma, and then cleaned and passivated for about 2 hours with an externally generated fluorine based plasma. As FIG. 3 indicates, the performance of the plasma passivated chambers is as much as one standard deviation (sigma) better than that of the conventionally passivated chambers.

While the present invention is illustrated with particular embodiments, the invention is intended to include all variations and modifications falling within the scope of the appended claims.

We claim:

1. A method of passivating a laser discharge chamber prior to laser operation, comprising:
   A) forming a fluorine based plasma from one or more first gases, said first gases comprising a fluorine containing gas;
   B) flowing said first gases into a plasma source external to said laser discharge chamber prior to the assembly of the chamber into the laser, said fluorine containing gas flowing at a flow rate in excess of about 5 standard cubic centimeters per minute (sccm);
   C) applying a radio frequency signal to said first gases to form said fluorine based plasma in said plasma source;
   D) flowing said fluorine based plasma into said laser discharge chamber; and
   E) reacting said fluorine-based plasma with internal surfaces of said laser discharge chamber to passivate said internal surfaces.

2. The method of claim 1 wherein said fluorine containing gas is a fluorine containing gas selected from the group consisting of $NF_3$, $F_2$, $CF_4$, $SF_6$, and mixtures thereof.

3. The method of claim 1 wherein applying said radio frequency signal to said first gases comprises inductively applying said radio frequency signal to said first gases.

4. The method of claim 1 wherein forming said fluorine based plasma comprises:
   flowing said first gases into said laser discharge chamber, said fluorine containing gas flowing at a flow rate of about 5 sccm to about 25 sccm; and
   applying a radio frequency signal to said first gases to form said fluorine based plasma in said laser discharge chamber.

5. The method of claim 1 wherein reacting said fluorine based plasma with internal surfaces of said laser discharge chamber comprises reacting said fluorine based plasma with said internal surfaces for a first period of time of about 0.5 hours to about 2.0 hours.

6. The method of claim 5 further comprising selecting said first period of time by determining a fluorine plasma reaction endpoint.

7. The method of claim 5 further comprising maintaining a pressure in said laser discharge chamber of about 100 millitorr to about 1.5 torr for said first period of time.

8. The method of claim 1 further comprising maintaining a temperature of said discharge chamber of about 50° C. to about 100° C.

9. The method of claim 1 further comprising flowing said fluorine based plasma through said laser discharge chamber and out of a discharge chamber exit port.

10. The method of claim 1 wherein said first gases comprise an oxygen containing gas.

11. The method of claim 1 further comprising:
   forming an oxygen based plasma from one or more second gases, said second gases comprising an oxygen containing gas; and
   reacting said oxygen based plasma with said internal surfaces of said laser discharge chamber to clean said internal surfaces.

12. The method of claim 11 wherein said oxygen containing gas is an oxygen containing gas selected from the group consisting of $O_2$, $N_2O$, and mixtures thereof.

13. The method of claim 11 wherein forming said oxygen based plasma comprises:
   flowing said second gases into a plasma source external to said laser discharge chamber, said oxygen containing gas flowing at a flow rate of about 10 sccm to about 50 sccm;

applying a radio frequency signal to said second gases to form said oxygen based plasma in said plasma source; and flowing said oxygen based plasma into said laser discharge chamber.

14. The method of claim 13 wherein applying said radio frequency signal to said second gases comprises inductively applying said radio frequency signal to said second gases.

15. The method of claim 11 wherein forming said oxygen based plasma comprises:

flowing said second gases into said laser discharge chamber, said oxygen containing gas flowing at a flow rate of about 10 sccm to about 50 sccm; and applying a radio frequency signal to said second gases to form said oxygen based plasma in said laser discharge chamber.

16. The method of claim 11 wherein reacting said oxygen based plasma with internal surfaces of said laser discharge chamber comprises reacting said oxygen based plasma with said internal surfaces for a second period of time of about 0.5 hours to about 2.0 hours.

17. The method of claim 16 further comprising selecting said second period of time by determining an oxygen plasma reaction endpoint.

18. The method of claim 16 further comprising maintaining a pressure in said laser discharge chamber of about 100 millitorr to about 1.5 torr for said second period of time.

19. The method of claim 11 further comprising flowing said oxygen based plasma through said laser discharge chamber and out of a discharge chamber exit port.

* * * * *